(12) United States Patent
Whitney et al.

(10) Patent No.: US 6,630,623 B1
(45) Date of Patent: Oct. 7, 2003

(54) ELECTRICALLY-CONDUCTIVE GRID SHIELD FOR SEMICONDUCTORS

(75) Inventors: David Whitney, San Jose, CA (US); Anthony V. Souza, Sunnyvale, CA (US)

(73) Assignee: Vishay Infrared Components, Inc., Santa Clara, CA (US)

( * ) Notice: Subject to any disclaimer, the term of this patent is extended or adjusted under 35 U.S.C. 154(b) by 0 days.

(21) Appl. No.: 09/547,475

(22) Filed: Apr. 12, 2000

(51) Int. Cl.[7] .................................................. H05K 9/00
(52) U.S. Cl. .............................. 174/35 R; 174/35 MS; 257/659; 250/237 R
(58) Field of Search ......................... 174/35 R, 35 MS; 361/816, 818; 257/659, 660; 250/237 R

(56) References Cited

U.S. PATENT DOCUMENTS 5,118,924 A * 6/1992 Mehra et al. ............ 250/211 J
5,166,772 A * 11/1992 Soldner et al. ............ 257/659
6,184,521 B1 * 2/2001 Coffin, IV et al. ...... 250/237 R

* cited by examiner

*Primary Examiner*—Hung V. Ngo
(74) *Attorney, Agent, or Firm*—Fish & Richardson P.C.

(57) ABSTRACT

An electrically-conductive grid placed between an LED and a photodiode prevents false triggers of the photodiode by transient electrical fields. The grid terminates the field but allows light output of the LED to pass to the photodiode.

11 Claims, 3 Drawing Sheets

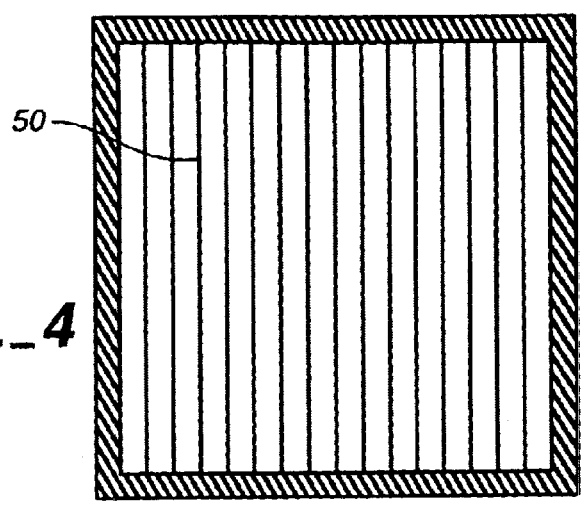
FIG._4
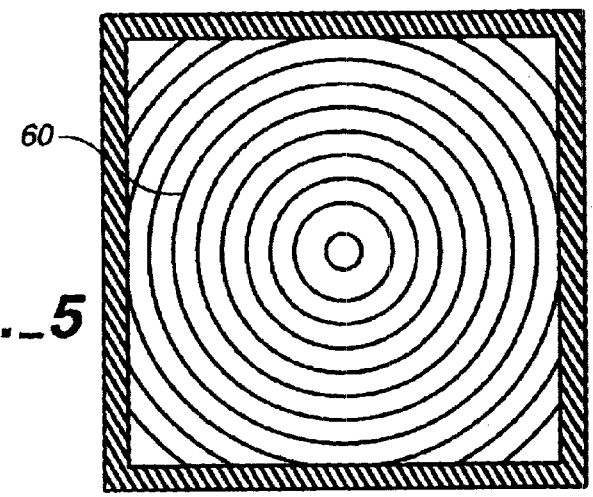
FIG._5
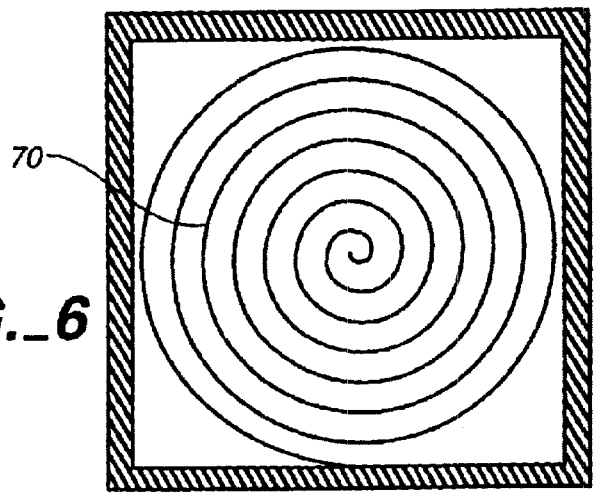
FIG._6

ELECTRICALLY-CONDUCTIVE GRID SHIELD FOR SEMICONDUCTORS

BACKGROUND OF THE INVENTION

In semiconductor devices, a transient electrical field may induce currents that result in false indications. Optocouplers may be especially susceptible to such phenomena when a high voltage pulse is received at the input stage. To overcome this problem, an electrically-conductive shield is provided to terminate and dissipate the electrical field while allowing light to pass.

BRIEF DESCRIPTION OF THE DRAWINGS

FIG. 4 illustrates a shield fashioned from parallel lines.

FIG. 5 illustrates a shield fashioned from concentric circles.

FIG. 6 illustrates a shield fashioned from a spiral line.

SUMMARY

In one aspect, the invention is directed to a shielded semiconductor device. The device has semiconductor structure with a surface and a photodiode, and a shield with one or more electrically conductive elements and one or more apertures therethrough. The shield is deposited over a portion of the surface of the semiconductor structure to prevent electrical fields from reaching the photodiode and permit light to pass through the apertures to the photodiode.

Implementations of the invention may include one or more of the following features. The electrically conductive elements may define a grid, a series of parallel lines, concentric circles, or a spiral, and may be fabricated from a conductor such as aluminum, copper, gold, silver, polysilicon, or a silicide. The electrically-conductive elements may be fabricated from an interconnect layer. The electrically conductive elements may be connected to ground potential or another potential.

DESCRIPTION OF THE INVENTION

Figure 1:
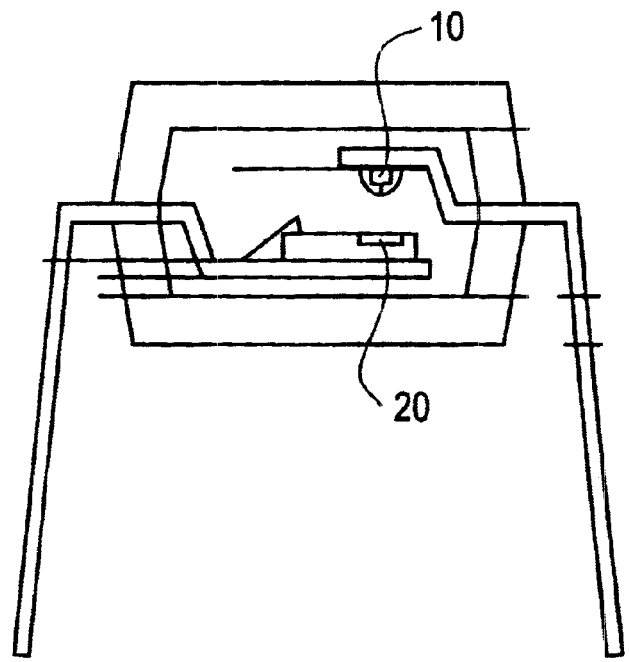
FIGS. 1 and 2 are cross-sections of an optocoupler.
Figure 2:
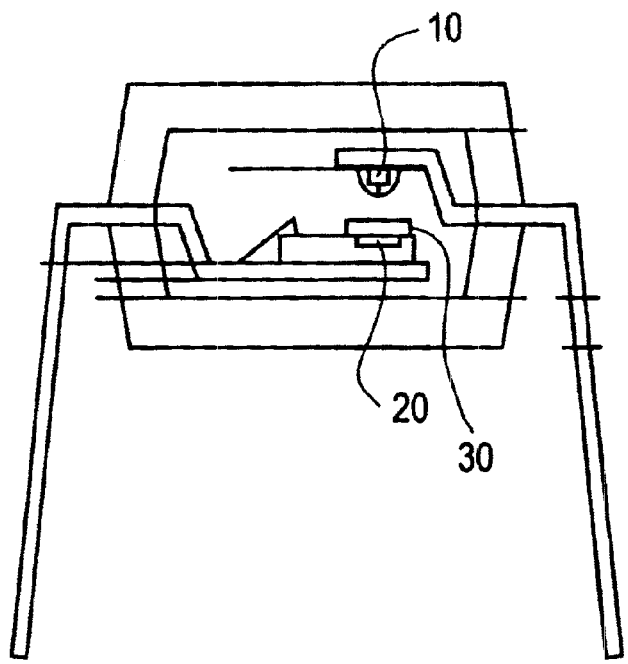

A cross-section of an optocoupler is shown in FIG. 1. There, a light-emitting diode (LED) 10 generates light that impinges on the surface of a photodiode 20. If a transient electrical signal, such as a spike, appears at the input to the coupler, care must be taken to avoid transmission from the LED 10 to the photodiode 20. When a large impulse signal appears at the input to the optocoupler, an electric field may be generated at the LED 10. If the signal is large enough, the field will cross over to the photodiode 20, inducing a current in the photodiode 20. Such false indications can be avoided by placing a shield 30 to terminate the electric field between the LED 10 and the photodiode 20, as shown in FIG. 2. The electrical shield 30 allows some portion of the light output of the LED 10 to pass through, but terminates the electrical field.

Figure 3:
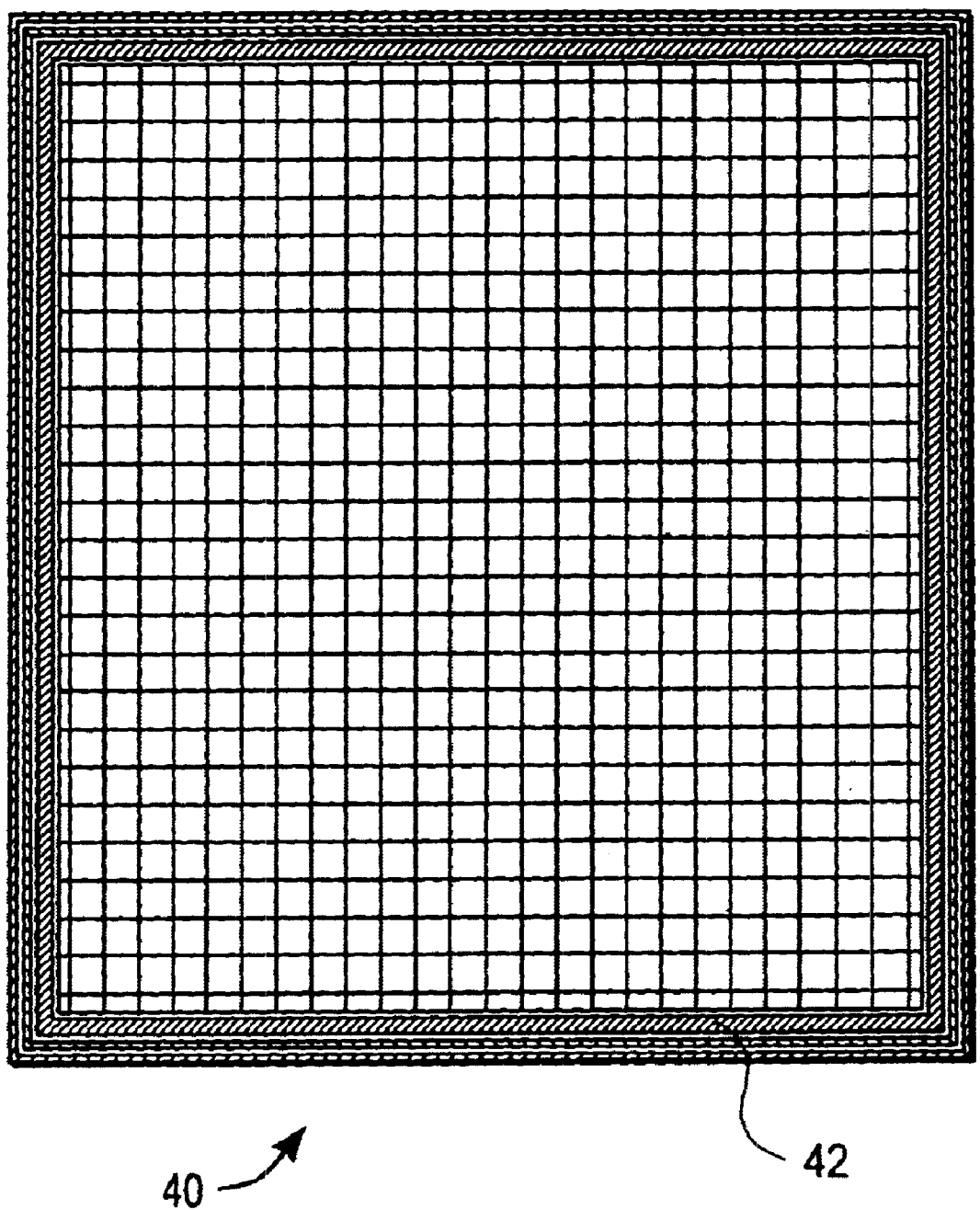
FIG. 3 illustrates a grid for shielding a photodiode.

The shield 30 can be fashioned as a grid of intersecting lines defining square, rectangular, triangular, or openings of other shapes. A grid 40 of square openings is shown in FIG. 3.

The shield 30 (or grid 40) could be deposited directly on the photodiode 20 as a layer having a thickness of 100 Å to 20,000 Å, depending on the process employed to fabricate the underlying devices. Alternatively, where the process provides a metallic interconnect layer, a portion of that layer can be utilized, isolating a section of the layer to create the shield 30 or grid 40.

The lines used to create the shield 30 or grid 40 could be as wide (or narrow) as the photolithographic process allows, e.g., 0.2 μm, up to any desired width, and the spacing between the lines could be the same as the line width or greater to achieve a blockage of almost 90% or less. As an upper limit, one might select a spacing-to-line-width ratio of twenty-to-one, although other ratios, greater or lesser, could be chosen to suit the application. Grids having lines 1 μm in thickness and spaced at 10 μm, providing a blockage of approximately 10%, have been created successfully. Where a preexisting interconnect layer is employed, the design rules for the grid will be predefined by the process.

Instead of a grid of intersecting lines, the shield 30 could be fashioned by depositing a series of parallel lines 50 as shown in FIG. 4, concentric circles 60 as shown in FIG. 5, or a spiral 70 as shown in FIG. 6, again blocking the electrical field but allowing light to pass.

The lines could be fabricated from any electrically-conductive material, such as aluminum, copper, gold, silver, polysilicon, and silicides.

The shield 30 or grid 40 would be connected to a point at ground potential or another potential to help discharge any induced field. As shown in FIG. 3, a border 42 at the periphery of the grid 40 provides a convenient connection point.

The shield 30 may be employed in devices other than optocouplers, i.e., in any device where an electrical field requires termination.

What is claimed is:

1. A shielded semiconductor device, comprising:
   a semiconductor structure having a surface and a photodiode; and
   a shield having one or more electrically conductive elements and one or more apertures therethrough and deposited over a portion of the surface of the semiconductor structure to prevent electrical fields from reaching the photodiode and permit light to pass through the apertures to the photodiode, the electrically conductive elements defining concentric circles or a spiral.

2. A device as set forth in claim 1, wherein the electrically conductive elements are fabricated from a conductor such as aluminum, copper, gold, silver, polysilicon, or a silicide.

3. A device as set forth in claim 1, wherein the electrically-conductive elements are fabricated from an interconnect layer.

4. A device as set forth in claim 1, wherein the electrically conductive elements are connected to ground potential or another potential.

5. An optocoupler, comprising:
   a device package including electric leads for the optocoupler, and defining an inner space inside the device package;
   a light emitting diode enclosed in the device package to generate light;
   a semiconductor structure having a photodiode enclosed in the device package to detect the light generated by the light emitting diode that travels through the inner space defined by the device package; and
   a shield including one or more electrically-conductive elements and one or more apertures therethrough, the shield positioned between the light emitting diode and the photodiode to prevent electrical fields from the light emitting diode from reaching the photodiode and permit the light from the light emitting diode to pass through the apertures to the photodiode.

6. The optocoupler of claim 5, wherein the shield is deposited over a portion of a surface of the semiconductor structure.

7. The optocoupler of claim 5, wherein the electrically conductive elements define a grid.

8. The optocoupler of claim 5, wherein the electrically conductive elements define a series of parallel lines, concentric circles, or a spiral.

9. The optocoupler of claim 5, wherein the electrically conductive elements are fabricated from a conductor such as aluminum, copper, gold, silver, polysilicon, or a silicide.

10. The optocoupler of claim 5, wherein the electrically conductive elements are fabricated from an interconnect layer.

11. The optocoupler of claim 5, wherein the electrically conductive elements are connected to ground potential or another potential.

* * * * *